United States Patent
Kim et al.

(10) Patent No.: US 8,314,341 B2
(45) Date of Patent: Nov. 20, 2012

(54) PRINTED CIRCUIT BOARD HAVING ELECTROMAGNETIC BANDGAP STRUCTURE

(75) Inventors: Han Kim, Yongin-si (KR); Mi-Ja Han, Junjoo-si (KR); Kang-Wook Bong, Seoul (KR); Hyo-Jic Jung, Daejeon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 376 days.

(21) Appl. No.: 12/654,370

(22) Filed: Dec. 17, 2009

(65) Prior Publication Data
US 2011/0067916 A1    Mar. 24, 2011

(30) Foreign Application Priority Data
Sep. 22, 2009    (KR) .................. 10-2009-0089611

(51) Int. Cl.
*H05K 9/00*    (2006.01)

(52) U.S. Cl. ........ 174/256; 174/250; 174/260; 361/763; 361/777; 361/780; 257/532; 257/665; 343/700 MS; 343/756; 333/206

(58) Field of Classification Search .......... 174/250–267, 174/359, 360, 390, 392; 361/760–767, 780–785, 361/118, 738, 790–795, 816, 818; 333/12, 333/22 R, 202–205, 235, 236, 238, 212, 167, 333/185, 175; 343/700 MS, 909; 438/612–618, 438/687, 780; 257/532, 665, 697, 686, 698, 257/724, 786

See application file for complete search history.

(56) References Cited

U.S. PATENT DOCUMENTS

| | | | |
|---|---|---|---|
| 6,002,593 A * | 12/1999 | Tohya et al. | 361/765 |
| 6,091,310 A * | 7/2000 | Utsumi et al. | 333/12 |
| 6,198,362 B1 * | 3/2001 | Harada et al. | 333/12 |
| 6,215,372 B1 * | 4/2001 | Novak | 333/12 |
| 6,329,604 B1 * | 12/2001 | Koya | 174/255 |
| 6,353,540 B1 * | 3/2002 | Akiba et al. | 361/794 |
| 6,365,828 B1 * | 4/2002 | Kinoshita et al. | 174/359 |
| 6,476,771 B1 * | 11/2002 | McKinzie, III | 343/756 |
| 6,512,181 B2 * | 1/2003 | Okubo et al. | 174/255 |
| 6,670,932 B1 * | 12/2003 | Diaz et al. | 343/909 |
| 6,798,666 B1 * | 9/2004 | Alexander et al. | 361/766 |
| 6,833,512 B2 * | 12/2004 | Liu | 174/262 |
| 6,897,831 B2 * | 5/2005 | McKinzie et al. | 343/909 |
| 6,967,282 B2 * | 11/2005 | Tonomura et al. | 174/392 |
| 7,016,198 B2 * | 3/2006 | Fessler et al. | 361/780 |
| 7,215,007 B2 * | 5/2007 | McKinzie et al. | 257/664 |

(Continued)

FOREIGN PATENT DOCUMENTS
JP          09205290 A    *    8/1997

*Primary Examiner* — Michail V Datskovskiy

(57) ABSTRACT

Disclosed is a printed circuit board into which an electromagnetic bandgap structure for blocking a noise is inserted. The electromagnetic bandgap structure can include a first conductive plate, a second conductive plate arranged on a planar surface that is different from that of the first conductive plate, a third conductive plate arranged on a planar surface that is different from that of the second conductive plate, a connection pattern arranged on a planar surface that is different from that of the second conductive plate, a first stitching via unit configured to connect the first conductive plate to one end of the connection pattern through the planar surface where the second conductive plate is arranged, and a second stitching via unit configured to connect the third conductive plate to the other end of the connection pattern through the planar surface where the second conductive plate is arranged.

6 Claims, 5 Drawing Sheets

U.S. PATENT DOCUMENTS

| | | | |
|---|---|---|---|
| 7,253,788 B2* | 8/2007 | Choi et al. | 343/909 |
| 7,405,698 B2* | 7/2008 | de Rochemont | 343/700 MS |
| 7,428,155 B2* | 9/2008 | Nakao | 361/794 |
| 7,466,560 B2* | 12/2008 | Hayashi et al. | 361/784 |
| 7,505,285 B2* | 3/2009 | Osaka | 361/788 |
| 7,586,444 B2* | 9/2009 | Berlin et al. | 343/700 MS |
| 7,592,957 B2* | 9/2009 | Achour et al. | 343/700 MS |
| 7,594,105 B2* | 9/2009 | Ohsaka | 713/2 |
| 7,626,216 B2* | 12/2009 | McKinzie, III | 257/192 |
| 7,675,729 B2* | 3/2010 | Anthony et al. | 361/118 |
| 7,843,702 B2* | 11/2010 | Choi et al. | 361/763 |
| 7,899,134 B2* | 3/2011 | Grossman et al. | 375/316 |
| 7,944,320 B2* | 5/2011 | Han et al. | 333/12 |
| 8,004,369 B2* | 8/2011 | Kwon et al. | 333/12 |
| 8,102,219 B2* | 1/2012 | Koo et al. | 333/12 |
| 8,125,290 B2* | 2/2012 | Wu et al. | 333/12 |
| 2005/0104678 A1* | 5/2005 | Shahparnia et al. | 333/12 |
| 2005/0134522 A1* | 6/2005 | Waltho | 343/909 |
| 2005/0194169 A1* | 9/2005 | Tonomura | 174/35 R |
| 2005/0205292 A1* | 9/2005 | Rogers et al. | 174/255 |
| 2006/0050010 A1* | 3/2006 | Choi et al. | 343/909 |
| 2006/0050491 A1* | 3/2006 | Hayashi et al. | 361/760 |
| 2006/0092093 A1* | 5/2006 | Choi et al. | 343/909 |
| 2007/0090398 A1* | 4/2007 | McKinzie | 257/192 |
| 2007/0228578 A1* | 10/2007 | Chou | 257/774 |
| 2009/0011922 A1* | 1/2009 | de Rochemont | 501/137 |
| 2009/0038840 A1* | 2/2009 | Kim et al. | 174/376 |
| 2009/0039984 A1* | 2/2009 | Kim et al. | 333/212 |
| 2009/0040741 A1* | 2/2009 | Hayashi et al. | 361/794 |
| 2009/0071709 A1* | 3/2009 | Han et al. | 174/360 |
| 2009/0080172 A1* | 3/2009 | Arslan et al. | 361/816 |
| 2009/0135570 A1* | 5/2009 | Chou et al. | 361/782 |
| 2009/0145646 A1* | 6/2009 | Han et al. | 174/260 |
| 2009/0160578 A1* | 6/2009 | Achour | 333/175 |
| 2009/0184782 A1* | 7/2009 | Koo et al. | 333/204 |
| 2009/0236141 A1* | 9/2009 | Kim et al. | 174/360 |
| 2009/0267704 A1* | 10/2009 | Chang et al. | 333/175 |
| 2009/0278626 A1* | 11/2009 | Lee | 333/185 |
| 2009/0315648 A1* | 12/2009 | Toyao | 333/238 |
| 2009/0322450 A1* | 12/2009 | Kim et al. | 333/204 |
| 2010/0108373 A1* | 5/2010 | Park | 174/376 |

* cited by examiner

PRINTED CIRCUIT BOARD HAVING ELECTROMAGNETIC BANDGAP STRUCTURE

CROSS-REFERENCE TO RELATED PATENT APPLICATIONS

This application claims the benefit of Korean Patent Application No. 10-2009-0089611, filed on Sep. 22, 2009, in the Korean Intellectual Property Office, the disclosure of which is incorporated herein in their entirety by reference.

BACKGROUND OF THE INVENTION

1. Field of the Invention

The present invention relates to a substrate, more specifically to a noise reducing substrate capable of reducing a noise by using an EBG structure.

2. Background Art

As the operation frequencies of electronic products get higher, the electromagnetic interference (EMI) has been considered as one the chronic noise problems. Especially, the operation frequencies of the electronic products have recently been in a range of several tens MHz to several GHz, and thus it is significantly needed to solve the EMI problem. Specifically, since there has been little study on the solution to a noise generated at an edge of the substrate as the EMI problem of substrate, it is difficult to completely block the noises at the substrate.

The noise problem is caused by an EMI noise, which is the interference between electromagnetic (EM) waves generated at any one of electronic circuits, devices, parts and/or the like and other EM waves generated at another one. As shown in FIG. 1, the EMI noise can be roughly classified into a radiation noise and a conduction noise.

The radiation noise transferred to an upper side (i.e., the mounting surface of an electronic part) of a substrate can be typically prevented by shielding the upper side of the substrate with an electromagnetic protective cap such as a metal cap. In contrast, it is not as easy to prevent the conduction noise. Furthermore, the operation frequencies of digital electronic products have become higher causing the digital electronic products more complex and, thus, it is difficult to find the solution.

SUMMARY

The present invention provides an EMI noise reducing printed circuit board that is more advantageous in spatial configuration, manufacturing cost and power consumption, by easily reducing noises having various frequency bands.

An aspect of the present invention features a printed circuit board into which an electromagnetic bandgap structure for blocking a noise is inserted. The electromagnetic bandgap structure can include: a first conductive plate; a second conductive plate arranged on a planar surface that is different from that of the first conductive plate; a third conductive plate arranged on a planar surface that is different from that of the second conductive plate; a connection pattern arranged on a planar surface that is different from that of the second conductive plate; a first stitching via unit configured to connect the first conductive plate to one end of the connection pattern through the planar surface where the second conductive plate is arranged; and a second stitching via unit configured to connect the third conductive plate to the other end of the connection pattern through the planar surface where the second conductive plate is arranged.

The first stitching via unit can include a first induction pattern arranged on the same planar surface as the second conductive plate and electrically separated from the second conductive plate; and a pair of vias configured to electrically connect opposite ends of the first induction pattern to the first conductive plate and the connection pattern, respectively.

The first conductive plate, the third conductive plate and the connection pattern can be arranged on a same planar surface.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

Figure 1:
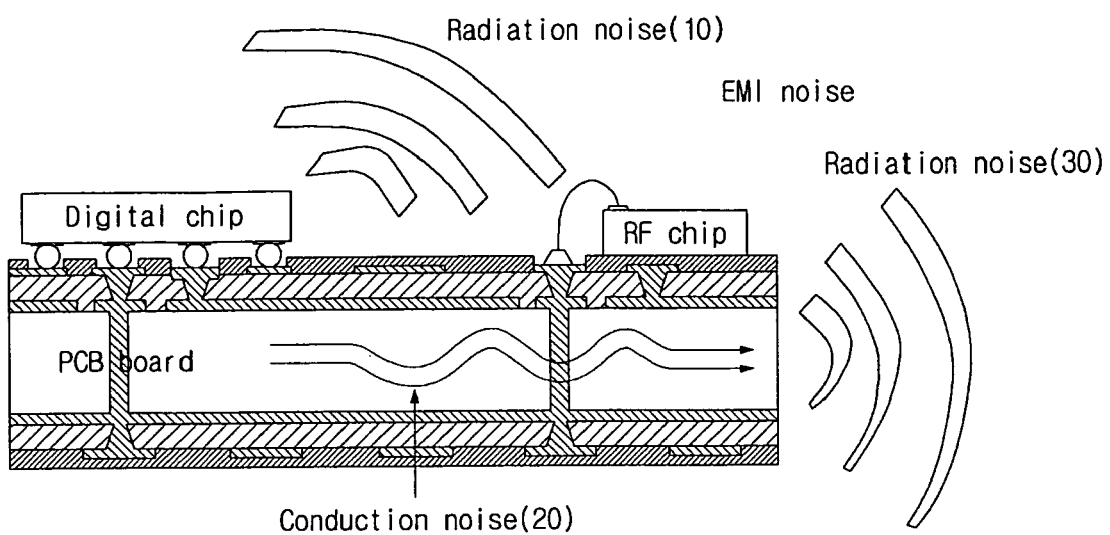
FIG. 1 shows how noises are transferred in a printed circuit board.
Figure 2:
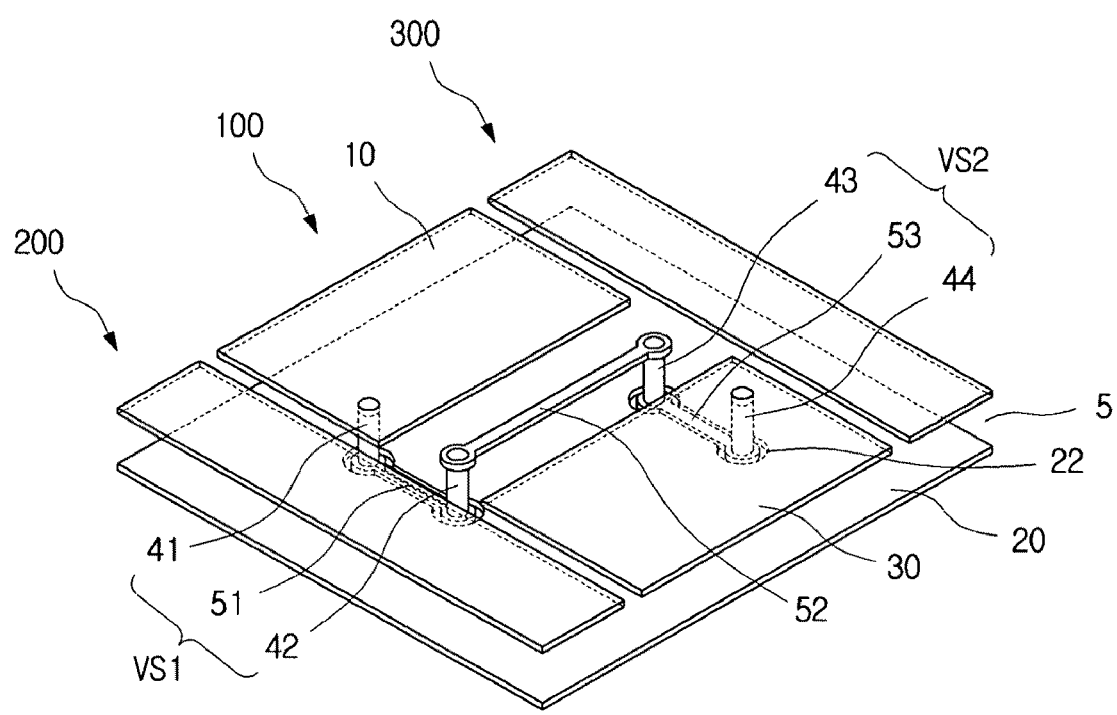
FIG. 2 is a perspective view showing a printed circuit board including an electromagnetic bandgap structure in accordance with an embodiment of the present invention.

A printed circuit board in accordance with an embodiment of the present invention, as shown in FIG. 2, includes an electromagnetic bandgap structure to prevent an electromagnetic wave generated at any one of electronic circuits, devices and the like (e.g., digital chips) from being transferred to another one of electronic circuits, devices and the like (e.g., radio frequency (RF) chips). That is, such a noise is blocked by the electromagnetic bandgap structure included in the printed circuit board.

The electromagnetic bandgap structure can include: a first conductive plate 10; a second conductive plate 20 arranged on a planar surface that is different from that of the first conductive plate 10; a third conductive plate 30 arranged on a planar surface that is different from that of the second conductive plate 20; a connection pattern 52 arranged on a planar surface that is different from that of the second conductive plate 20; a first stitching via unit VS1 connecting the first conductive plate 10 to one end of the connection pattern 52 through the planar surface where the second conductive plate 20 is arranged; and a second stitching via unit VS2 connecting the third conductive plate 30 to the other end of the connection pattern 52 through the planar surface where the second conductive plate 20 is arranged.

Here, the first and second stitching via units VS1 and VS2 can be electrically separated from the second conductive plate 20 by a clearance hole 22 formed on the second conductive plate 20. In such a structure, the first and third conductive plates 10 and 30 arranged to be spaced from each other can be electrically connected to each other through the first conductive plate 10→the first stitching via unit VS1→the connection pattern 52→the second stitching via unit VS2→the third conductive plate 30.

In accordance with the present embodiment, the capacitance and the inductance can be freely increased by repeatedly arranging various patterns 51, 52 and 53 and the vias 41, 42, 43 and 44 to connect the conductive plates 10 and 30 constituting the electromagnetic bandgap structure to one another, and it is possible to realize a stopband at a low frequency band without changing the size.

Further, it is possible to obtain several stopband frequencies and widen the bandwidth of the blockable frequencies by adjusting the sizes and/or shapes of the conductive plates 10 and 30, the respective distances between the connection pattern 52 and the conductive plates 10 and 30, the distance between the vias 41, 42, 43 and 44, and/or the length of the connection pattern 52.

The electromagnetic bandgap structure may be adequately arranged in one line or two or more lines at any position where the conductive noise needs to be blocked.

As shown in FIG. 2, the first stitching via unit VS1 can include a first induction pattern 51 arranged on the same planar surface as the second conductive plate 20, and a pair of vias 41 and 42 connecting opposite ends of the first induction pattern 51 to the first conductive plate 10 and the connection pattern 52, respectively.

Similarly, as shown in FIG. 2, the second stitching via unit VS2 can include a second induction pattern 53 arranged on the same planar surface as the second conductive plate 20, and a pair of vias 43 and 44 connecting opposite ends of the second induction pattern 53 to the connection pattern 52 and the third conductive plate 30, respectively.

At this time, as shown in FIG. 2, the first conductive plate 10, the third conductive plate 30, and the connection pattern 52 can be arranged on the same planar surface. In more detail, the connection pattern 52 can be arranged between the first and second conductive plates 10 and 30.

In this case, a capacitance component can be additionally provided between the connection pattern 52 and the first conductive plate 10 and between the connection pattern 52 and the third conductive plate 30, and the electromagnetic bandgap structure can have a 2-layered structure. However, the present invention is not limited to this embodiment, and the connection pattern 52 may be alternatively arranged on an additional planar surface.

In the meantime, as shown in FIG. 2, the first stitching via unit VS1 can include one induction pattern 51 and one pair of vias 41 and 42. However, the present invention is not limited to this embodiment, and the first stitching via unit can alternatively have a structure where two or more patterns and two or more pairs of vias are arranged. The same is applicable to the second stitching via unit VS2.

Described below is the principle by which the structure shown in FIG. 2 can function as an electromagnetic bandgap structure blocking a signal of a certain frequency band.

A dielectric material 5 can be interposed between the first and third conductive plates 10 and 30. This may cause a capacitance component to be formed between the second conductive plate 20 and the first and third conductive plates 10 and 30, between the first conductive plate 10 and the connection pattern 52, and between the third conductive plate 30 and the connection pattern 52. Moreover, there can be an inductance component connecting through the via 41→the first induction pattern 51→the via 42 →the connection pattern 52→the via 43→the second induction pattern 53→the via 44 between the adjacent two conductive plates 10 and 30 by the first and second stitching via units VS1 and VS2.

Here, the value of the capacitance component can vary according to various factors such as the spaced distances between the second conductive plate 20 and the first and third conductive plates 10 and 30 and between the adjacent two conductive plates 10 and 30, the permittivity of the dielectric material 5 and the size, shape and area of conductive plate, etc.

The value of the inductance component can also vary according to various factors such as the shape, length, depth, width and area of the vias 41, 42, 43 and 44, induction patterns 51 and 53, and/or the connection pattern 52. For example, to increase the inductance value, the connection pattern 52 may have a bendable shape such as a curve or a spiral and the number of the vias may be multiplied by an even number.

Accordingly, adjusting and designing various aforementioned factors adequately can make it possible to allow the structure of FIG. 2 to function as an electromagnetic bandgap structure (i.e. a band stop filter) for removing or blocking a certain noise or a certain signal of a target frequency band.

Figure 3:
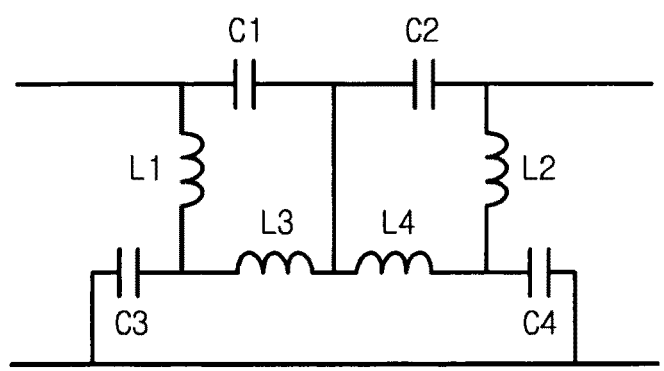
FIG. 3 shows an equivalent circuit of the electromagnetic bandgap structure of FIG. 2.

FIG. 3 shows an equivalent circuit of the electromagnetic bandgap structure of FIG. 2. Inductance components L1, L2, L3 and L4 and capacitance components C1, C2, C3 and C4 shown in FIG. 3 can be freely varied by adjusting the aforementioned design factors. As a result, it is possible to realize a stopband characteristic at a low frequency band without changing the size. Further, it is possible to obtain several stopband frequencies and widen the bandwidth of blockable frequencies by various design modifications.

Figure 4:
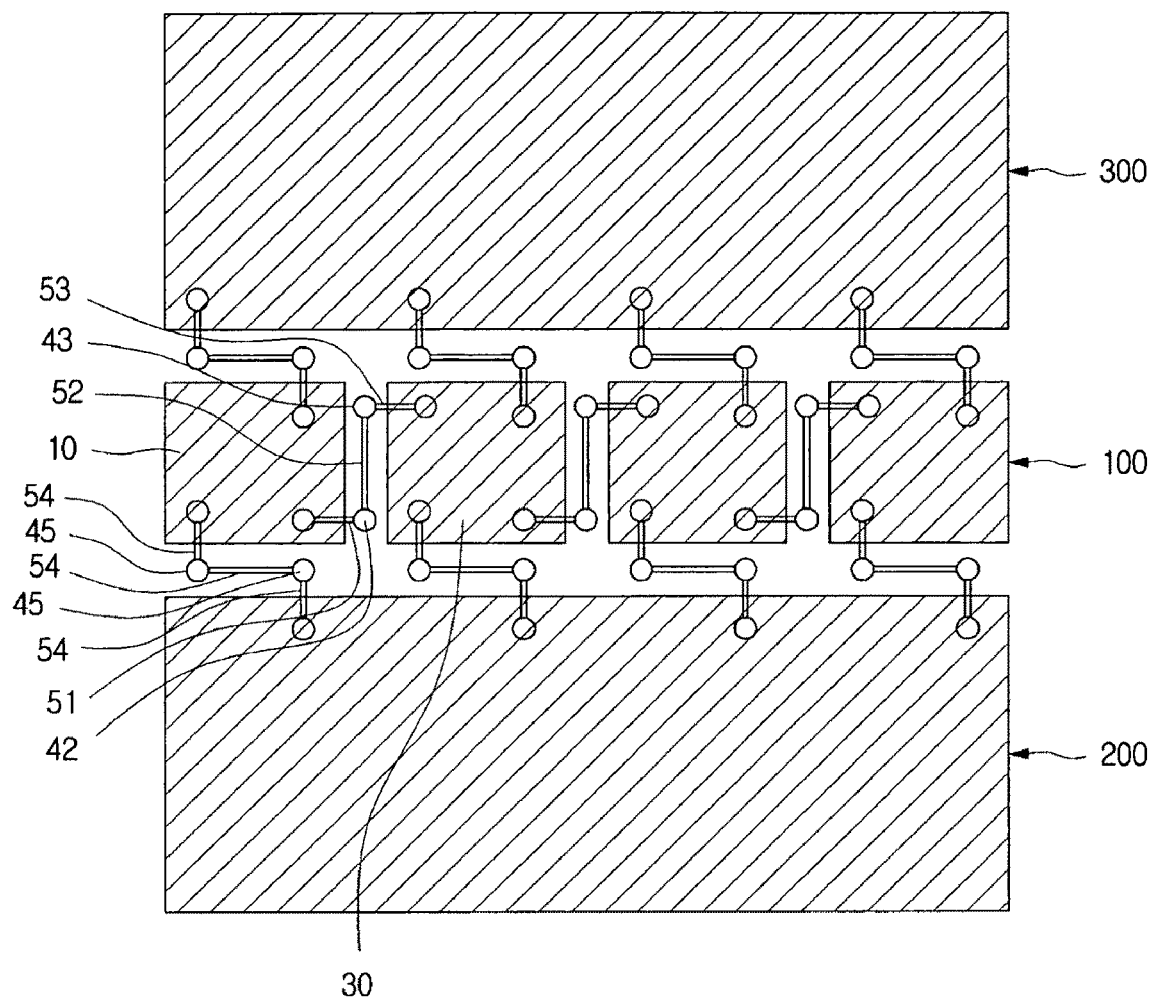
FIG. 4 is a plan view showing a printed circuit board including the electromagnetic bandgap structure in accordance with the embodiment of the present invention.
Figure 5:
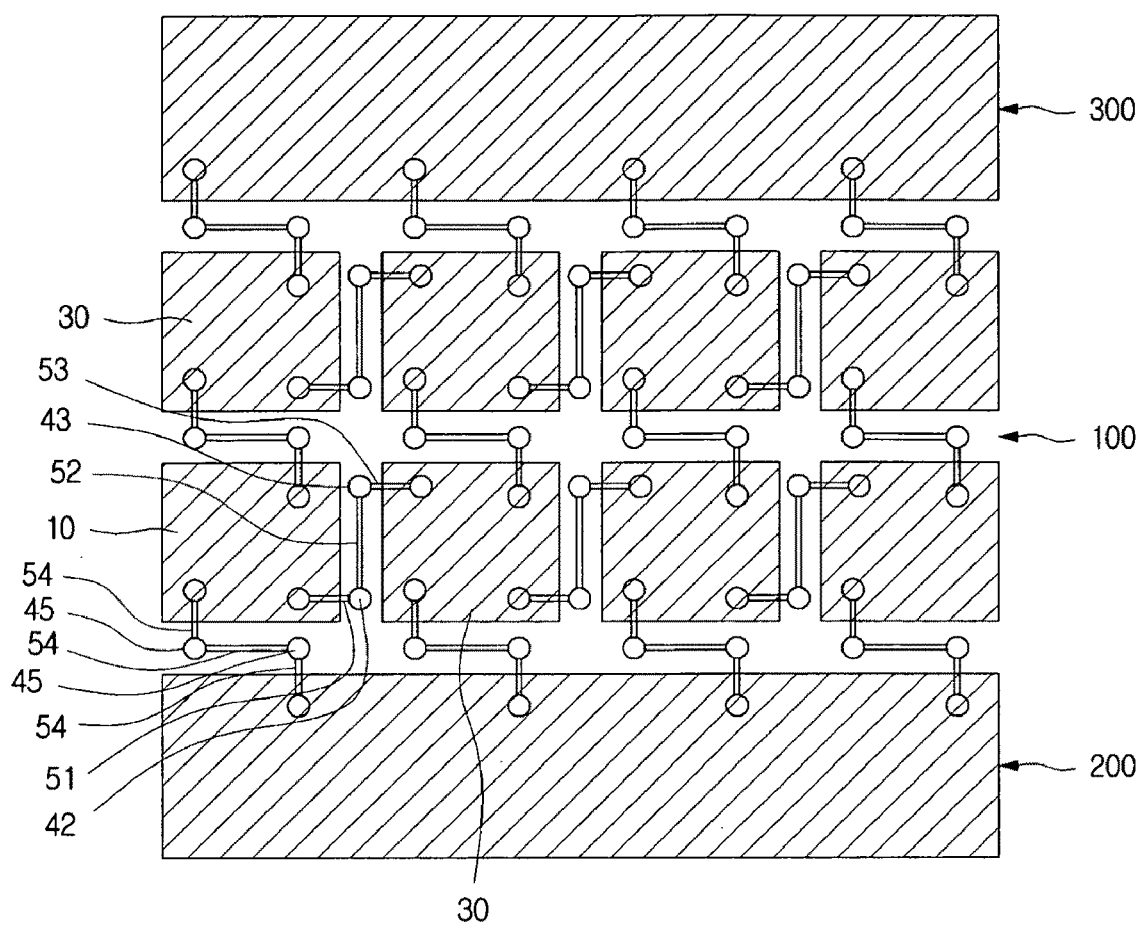
FIG. 5 is a plan view showing a printed circuit board including an electromagnetic bandgap structure in accordance with another embodiment of the present invention.

FIG. 4 shows that the electromagnetic bandgap structures are arranged in one line between two regions 200 and 300 where noises need to be blocked, and FIG. 5 shows that the electromagnetic bandgap structures are arranged in two lines between the two regions 200 and 300. If the space is sufficiently large in the design specification, noise would be more effectively reduced by arranging as many electromagnetic bandgap structures as possible.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. A printed circuit board into which an electromagnetic bandgap structure for blocking a noise is inserted, the electromagnetic bandgap structure comprising:
   a first conductive plate;
   a second conductive plate arranged on a planar surface that is different from that of the first conductive plate;
   a third conductive plate arranged on a planar surface that is different from that of the second conductive plate;
   a connection pattern arranged on a planar surface that is different from that of the second conductive plate;
   a first stitching via unit configured to connect the first conductive plate to one end of the connection pattern through the planar surface where the second conductive plate is arranged; and a second stitching via unit configured to connect the third conductive plate to the other end of the connection pattern through the planar surface where the second conductive plate is arranged.

2. The printed circuit board of claim 1, wherein the first stitching via unit comprises:

a first induction pattern arranged on the same planar surface as the second conductive plate and electrically separated from the second conductive plate; and a pair of vias configured to electrically connect opposite ends of the first induction pattern to the first conductive plate and the connection pattern, respectively.

3. The printed circuit board of claim 1, wherein the first conductive plate, the third conductive plate and the connection pattern are arranged on a same planar surface.

4. The printed circuit board of claim 3, wherein the connection pattern is arranged between the first conductive plate and the third conductive plate.

5. The printed circuit board of claim 2, wherein the first conductive plate, the third conductive plate and the connection pattern are arranged on a same planar surface.

6. The printed circuit board of claim 5, wherein the connection pattern is arranged between the first conductive plate and the third conductive plate.

* * * * *